United States Patent
Amemiya

Patent Number: 6,162,566
Date of Patent: Dec. 19, 2000

[54] MASK HOLDER FOR SUPPORTING TRANSFER MASK

[75] Inventor: Isao Amemiya, Yamanashi, Japan

[73] Assignee: Hoya Corporation, Tokyo, Japan

[21] Appl. No.: 09/199,318

[22] Filed: Nov. 25, 1998

[30] Foreign Application Priority Data

Nov. 26, 1997 [JP] Japan .................................. 9-340613

[51] Int. Cl.[7] .................................................. G03F 9/00
[52] U.S. Cl. .................................................. 430/5; 378/35
[58] Field of Search ............................... 430/5, 322, 323; 378/35

[56] References Cited

U.S. PATENT DOCUMENTS 4,986,007   1/1991   Laganza et al. ........................... 33/621
5,902,706   5/1999   Huh ............................................ 430/5

FOREIGN PATENT DOCUMENTS 6-130655   5/1994   Japan .
9-92610    4/1997   Japan .

*Primary Examiner*—S. Rosasco
*Attorney, Agent, or Firm*—Sughrue, Mion, Zinn, Macpeak & Seas, PLLC

[57] ABSTRACT

In a mask holder for supporting a transfer mask which includes a thin-film portion having an aperture pattern forming region and a supporting frame portion for supporting the thin-film portion, the mask holder contacts with the thin-film portion except for the aperture pattern forming region.

24 Claims, 3 Drawing Sheets

MASK HOLDER FOR SUPPORTING TRANSFER MASK

BACKGROUND OF THE INVENTION

This invention relates to a mask holder for supporting a transfer mask for use in electron-beam exposure, ion-beam exposure, X-ray exposure and the like.

Recently, attention has been paid to electron-beam lithography, ion-beam lithography, and X-ray lithography as a method of manufacturing super fine device within a sub-half micron region, a quarter-micron region, or even less than 0.2 $\mu$m for next generation. However, it is yet uncertain whether or not either of them will be suitable as a mass-production technique.

Among them, an exposure method, which is called a direct writing system (namely, one-drawing system), conventionally has come in practice with respect to electron-beam exposure using an electron beam.

In such a direct writing system, drawing operation is carried out by scanning an exposure pattern by the use of the electron-beam or the electron-ray having a small beam spot. In this method, it may be possible to make a super fine pattern.

However, this method has poor throughput because exposure time is excessively long. In consequence, this method is unsuitable for mass-production of a large integrated circuit (namely, LSI) or a very large scale integrated circuit (namely, VLSI) As a result, it has been assumed that this method is not preferable for the mass-production technique of the LSI or the VLSI.

Therefore, suggestion has been made about a drawing method which is called cell-projection exposure (this may be called block exposure) in recent years. In this cell-projection exposure system, the exposure is entirely and partially carried out by using various partial patterns (namely, component patterns) which repeatedly appear in the exposure pattern as masks. In this event, the exposure of a desired pattern is rapidly carried out by combining these various partial patterns (component patterns).

This method has short drawing duration (short writing time) and large productivity. Further, it is possible to make the superfine pattern in this drawing system.

In consequence, attention has been focused on this drawing method as the LSI manufacturing technique of the next generation.

In this event, a plurality of component patterns different from each other are normally formed on the transfer mask in this drawing method. In the exposure using this mask, the electron-beam is shaped by the use of the component pattern (namely, aperture), and a desired region (namely, block or cell) is partially and entirely exposed. When the transfer of one component pattern is terminated, the electron beam is deflected, and the transfer mask is moved to transfer the subsequent component pattern. The drawing is performed by repeating this operation.

Meanwhile, the transfer mask for a charged particle-ray exposure, such as, the cell-projection exposure due to the above-mentioned electron-beam, generally corresponds to a mask (namely, a stencil mask) having apertures.

In such a stencil mask, aperture patterns (namely, apertures) are formed so as to transmit the charged particle-ray for a thin-film portion supported by a supporting frame portion.

That is, there is no substance currently available which excellently transmits the charged particle-ray. Consequently, no substance can be interposed at a portion for passing the charged particle-ray. Therefore, this portion must be inevitably penetrated.

Moreover, when the aperture pattern is formed on a thick substrate, a passing charged particle-ray is adversely affected by a sidewall of the aperture pattern. Consequently, it is impossible to accurately transfer a pattern. Therefore, the portion (aperture pattern-forming region), in which the aperture pattern is formed, must be formed by a thin-film. Under this circumstance, the supporting frame portion having a preselected strength is necessary to support the thin-film with plane accuracy.

Such a transfer mask used for the cell-projection exposure has been conventionally fabricated by various methods. However, the transfer mask is generally manufactured by processing a silicon substrate (namely, a commercial silicon wafer and the like) using the known lithography technique or the known micro-machine processing technique from the viewpoint of processing performance or strength.

For instance, the supporting frame portion and the thin-film portion supported by the supporting frame portion are formed by etching and processing a back surface of the silicon substrate. Further, the transfer mask is fabricated by forming the aperture patterns in the thin-film portion.

In this case, an SOI (Silicon On Insulator) substrate, which is formed by laminating two silicon substrates via a $SiO_2$ layer, is often used as the substrate. Herein, a silicon thin-film portion is formed by using the $SiO_2$ layer as an etching stopper layer. For example, this method is disclosed in Japanese Unexamined Patent Publication No. Hei 6-130655.

In this event, it is difficult to handle the above transfer mask used for the cell-projection exposure because the transfer mask has small outline dimension between about 10 and 20 mm☐. Further, the transfer mask is generally manufactured by performing the micro-machine process for a silicon crystal substrate and the like, and the thin-film portion and the supporting frame portion are integrated to each other. Consequently, the transfer mask is extremely weak for external impact.

To solve these problems, the transfer mask is mounted to a mask holder formed by a metal conductor. Thereby, the handling becomes easy, and the transfer mask is protected from the external impact. Further, the mask holder, which mounts or supports the transfer mask, is attached to the electron-beam exposure apparatus, and allows heat to be radiated and electric charge to escape through the mask holder, thereby preventing accumulation of heat and charge. Herein, the heat and the electrical charge are generated for the transfer mask when the electron-beam is irradiated.

For example, a conventional mask holder that mounts the transfer mask has been disclosed in Japanese Unexamined Patent Publication No. Hei 9-92610.

In such a conventional mask holder, the transfer mask has a plurality of apertures. With this structure, the mask holder is arranged at an outer surface of the transfer mask except for the apertures.

However, the conventional example has the following problems.

First, the mask holder contacts with an upper portion and a lower portion of an aperture pattern. Therefore, it is required that a penetration hole (namely, an aperture hole pattern) is formed at a portion corresponding to the aperture in the mask holder. However, high accuracy is needed for the position and the shape of the penetration hole. In consequence, the formation of the penetration hole is complex, and the cost becomes high.

Even when the positioning accuracy and the shape accuracy of the penetration hole formed for the mask holder are satisfied, the aperture must be aligned with the penetration hole with high accuracy when the transfer mask is mounted to the mask holder. Consequently, the mounting operation becomes complicated.

As a result, the transfer mask often becomes useless because of mount defects occurring when an acceptable transfer mask, which is expensive and has difficulty in the fabrication, is mounted for the mask holder. This results in large loss.

Moreover, the mask holder contacts with the upper portion and the lower portion of the aperture pattern, and an aperture pattern forming region is formed by a thin-film portion (membrane). Consequently, distortion or twist takes place for the thin-film portion, and gives an adverse affect for transfer accuracy.

In addition, the mask holder contacts with the aperture pattern forming region of the thin-film portion. In consequence, the transfer mask is readily destroyed.

SUMMARY OF THE INVENTION

It is therefore an object of this invention to provide a mask holder for supporting a transfer mask which mask holder is capable of readily being fabricated.

It is another object of this invention to provide a mask holder for supporting a transfer mask which is capable of readily mounting the transfer mask to the mask holder.

It is still another object of this invention to provide a mask holder for supporting a transfer mask, which does not adversely affect transfer accuracy by its mounting operation.

It is further object of this invention to provide a mask holder for supporting a transfer mask which has such a structure that the transfer mask is not easily damaged.

According to this invention, a mask holder supports a transfer mask. The transfer mask includes a thin-film portion having an aperture pattern forming region and a supporting frame portion for supporting the thin-film portion.

With such a structure, the mask holder contacts with the thin-film portion except for the aperture pattern forming region.

For instance, the mask holder comprises an upper portion holder and a lower portion holder. In this case, the upper portion holder partially contacts with an upper surface of the thin-film portion while the lower portion holder partially contacts with a bottom surface of the supporting frame portion.

Herein, the aperture pattern-forming region comprises a plurality of aperture patterns and apertures. The aperture pattern forming region corresponds to a region for forming a drawing pattern (an exposure pattern). In this condition, a charged particle-ray or an X-ray passes through the apertures.

In this case, the upper portion holder contacts with the upper surface of the thin-film portion with a predetermined distance while the mask holder has a preselected thickness. It is preferable that the distance is larger than the thickness.

Further, the upper portion holder is fixed to the lower portion holder via a fixing screw.

More specifically, in such a mask holder of this invention, the mask holder does not contact with the upper portion and the lower portion of the aperture pattern. In consequence, it is unnecessary to form the penetration holes in the mask holder. As a result, the formation of the mask holder becomes easy.

Further, the penetration holes are not formed in the mask holder. Consequently, it is not required to align the position between the aperture and the penetration hole when the transfer mask is mounted to the mask holder. As a result, the mount operation becomes easy, and failure of the mount operation is extremely little.

Moreover, the mask holder does not contact with the upper and lower portions of the aperture pattern. Consequently, the distortion and the twist does not take place for the thin-film portion. As a result, an adverse affect is not given to the transfer accuracy.

In addition, the mask holder does not contact with the aperture pattern forming region made by the thin-film portion. In consequence, the transfer mask is not readily damaged.

Further, the mask holder is formed by material having hardness of the same level as the silicon. Consequently, when the transfer mask is mounted to the mask holder, it is unlikely that a defect will occur for the transfer mask. As a result, the mask holder can be suitably used to support the transfer mask which is formed by processing the SOI substrate and the like.

DESCRIPTION OF THE PREFERRED EMBODIMENTS

Figure 1:
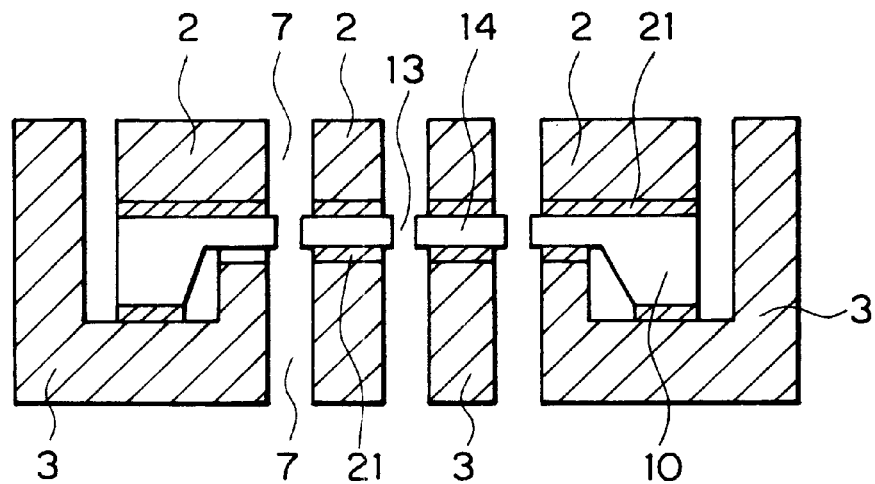
FIG. 1 is a cross sectional view showing an example of a conventional mask holder for supporting a transfer mask.

Referring to FIG. 1, a conventional mask holder for supporting a transfer mask will first be described for a better understanding of this invention. The mask holder is equivalent to the conventional mask holder mentioned in the background section of the instant specification.

As shown in FIG. 1, a transfer mask 10 has a plurality of apertures 13. With this structure, a mask holder is arranged at an outer surface of the transfer mask 10 except for the apertures 13.

More specifically, an upper mask holder 2 contacts with the aperture patterns 14 via adhesives 21 at an upper portion of the aperture pattern 14 of the transfer mask 10. On the other hand, a lower mask holder 3 contacts with the aperture patterns 14 via adhesives 21 at a lower portion of the aperture pattern 14 of the transfer mask 10.

With such a structure, penetration holes 7 (namely, escaping holes) are formed at portions corresponding to the apertures 13 in the upper mask holder 2 and the lower mask holder 3, respectively.

However, the conventional mask holder has the following problems, as mentioned before.

First, the mask holder 2, 3 contacts with an upper portion and a lower portion of an aperture pattern 14. Therefore, it is required that penetration holes 7 are formed at portions corresponding to the apertures 13 in the mask holder 2, 3. However, high accuracy is needed for the position and the shape of the penetration holes 7. In consequence, the formation of the penetration hole 7 is complex, and the cost becomes high.

Even when the positioning accuracy and the shape accuracy of the penetration hole 7 formed for the mask holder 2, 3 are satisfied, the apertures 13 must be aligned with the penetration holes 7 with high accuracy when the transfer mask 10 is mounted to the mask holder 2, 3.

Consequently, the mounting operation becomes complicated. As a result, the transfer mask 10 often becomes useless because of mount defect occurring when the transfer mask 10 is mounted for the mask holder 2, 3. This results in large loss.

Moreover, the mask holder 2, 3 contacts with the upper portion and the lower portion of the aperture pattern 14, and an aperture pattern forming region is formed by a thin-film portion (membrane). Consequently, distortion or twist takes place for the thin-film portion, and gives an adverse affect for transfer accuracy.

In addition, the mask holder 2, 3 contacts with the aperture pattern forming region of the thin-film portion. In consequence, the transfer mask is readily damaged.

Taking the above-mentioned problems into consideration, this invention provides a mask holder for supporting a transfer mask which capable of readily being fabricated and easily mounting a transfer mask.

(First Embodiment)

Figure 2:
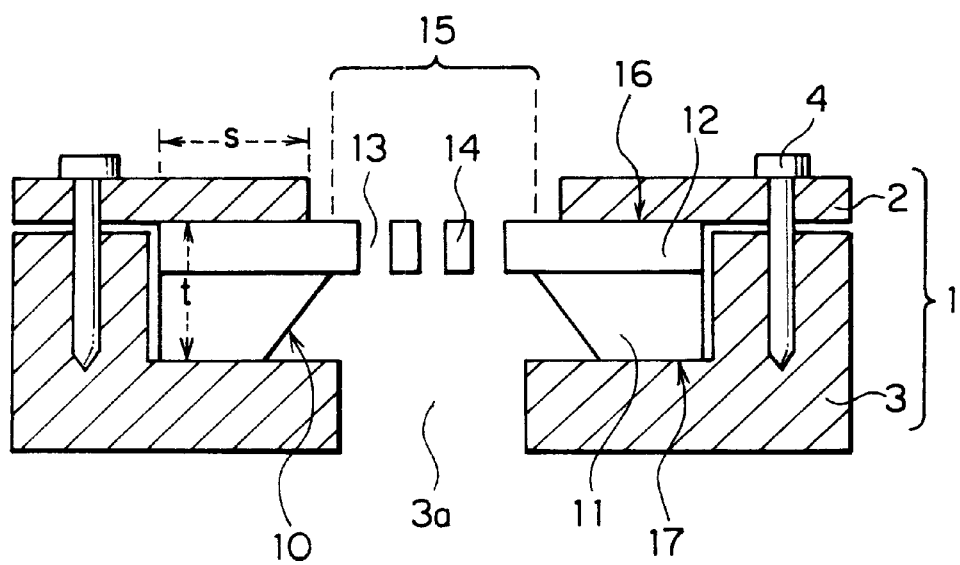
FIG. 2 is a cross sectional view showing a mask holder for supporting a transfer mask according to a first embodiment of this invention.

Referring to FIG. 2, description will be made about a mask holder for supporting a transfer mask according to a first embodiment of this invention.

As shown in FIG. 2, a mask holder 1 for supporting a transfer mask 10 is composed of an upper portion holder 2 and a lower portion holder 3. In this event, an aperture portion 3a for passing charged particle-ray is formed in the lower holder 3.

The mask holder 1 surrounds an outer surface of the transfer mask 10 except for an upper portion and a lower portion of the transfer mask 10 in an aperture pattern forming region 15 (namely, an exposure pattern). Herein, the transfer mask 10 is made by forming apertures 13 in a thin-film portion 12 supported by a supporting frame portion 11.

Thus, the mask holder 1 does not contact with the upper portion and the lower portion of the aperture pattern 14. Therefore, it is unnecessary to form penetration holes corresponding to the apertures 13 in the mask holder 1, like the conventional case. Consequently, the mask holder 1 can be readily manufactured.

Further, it is not required to align a position between the apertures 13 and the penetration holes when the transfer mask 10 is mounted to the mask holder 1, like the conventional case. In consequence, the mount operation can be easily carried out, and failure of the mount operation is reduced.

Moreover, the mask holder 1 does not contact with the upper and lower portions of the aperture pattern 14 made by a thin-film portion 12 (membrane), as mentioned above. Consequently, the distortion and the twist do not take place for the thin-film portion 12. As a result, an adverse affect is not given to the transfer accuracy.

As mentioned before, the mask holder 1 does not contact with the aperture pattern forming region 15 made by the thin-film portion 12. In consequence, the transfer mask 10 is not readily damaged.

With such a structure, the mask holder 1 contacts with an upper surface 16 of the thin-film portion 12 while it contacts with a bottom surface 17 of the supporting frame portion 11. By this contact, the mask holder 1 carries out radiation of heat and prevents change-up of electric charge. Herein, it is to be noted that the heat and the electrical charge are generated for the transfer mask 10 when irradiated by the charged particle-ray.

In this case, the upper portion holder 2 bonds with the upper surface 16 of the transfer mask 10 except for the aperture pattern forming region 15. In this condition, it is preferable to reduce generation of distortion of the thin-film portion 12 (membrane) or the entire transfer mask 10 that a distance s in which the upper portion holder 2 bonds with the upper surface 16 of the transfer mask 10 is larger than a thickness t of the transfer mask 10.

In this event, the upper portion holder 2 is fixed to the lower portion holder 3 by the use of a fixing screw 4. Herein, it is desirable that the screws are tightened at positions of two points, preferably, three points to uniform tightening force.

In this case, material containing silver and/or copper of 50 wt % or more in composition, such as silver, copper, silver-copper alloy, and phosphorus bronze, is preferable as material of the mask holder 1 from the viewpoint of heat conductivity, electrical conductivity, and mechanical processing characteristic.

In particular, the silver-copper alloy is desirable from the viewpoint of the mechanical processing characteristic. It is difficult to mechanically process the silver or the copper into a desired shape because the silver or the copper is a relatively soft material in comparison with the alloy.

Therefore, the copper of several to several tens % is, for example, added into the silver to be alloyed. In consequence, the mechanical processing characteristic is improved because material hardness thereof becomes twice or more as compared with the silver or the copper.

In this event, the other element may be added into the silver-copper alloy within the range such that the above-mentioned characteristic is not deteriorated.

Alternatively, the mask holder 1 may be formed by at least one selected from the group consisting of silver, copper, silver-copper alloy, copper-beryllium alloy, aluminum-copper alloy, palladium, non-magnetic stainless, tantalum, tungsten, molybdenum, platinum, ruthenium, rhenium, titanium, aluminum, niobium, and zirconium. In this event, a noble metal layer may be coated over an entire surface of the mask holder 1 to prevent surface oxidation of the mask holder 1.

(Second Embodiment)

Figure 3:
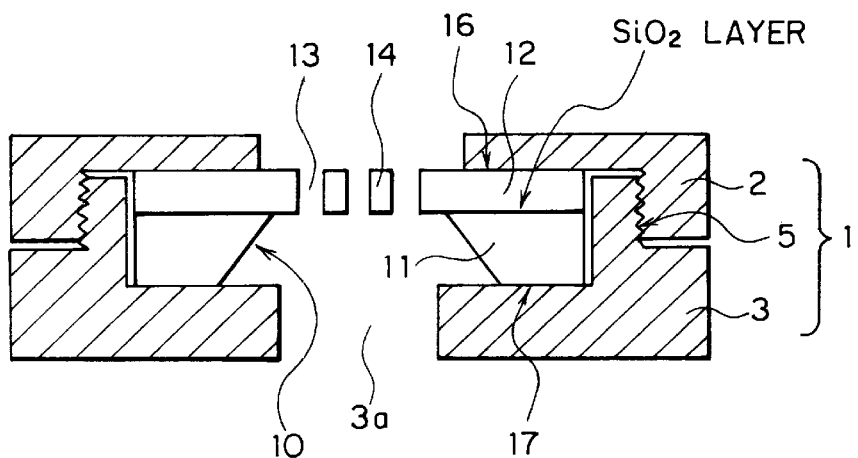
FIG. 3 is a cross sectional view showing a mask holder for supporting a transfer mask according to a second embodiment of this invention.

Subsequently, description will be made about a second embodiment of this invention with reference to FIG. 3.

The first embodiment is similar to the second embodiment except that the upper portion holder 2 is fixed to the lower portion holder 3 by screwing the lower portion holder 3 into the upper portion holder 2 via a screw structure portion 5. By using this method, tightening force becomes more uniform, and it is easy to adjust the tightening force.

(Third Embodiment)

Figure 4:
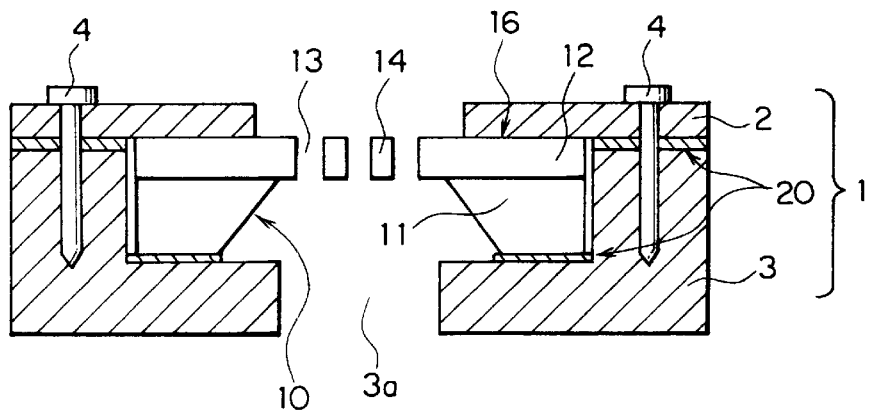
FIG. 4 is a cross sectional view showing a mask holder for supporting a transfer mask according to a third embodiment of this invention.

Subsequently, description will be made about a third embodiment with reference to FIG. 4.

The third embodiment is similar to the first embodiment except that buffer material layers 20 are interposed at a connection surface between the upper portion holder 2 and the lower portion holder 3 and a connection surface between the bottom surface 17 of the supporting frame portion 11 and the lower portion holder 3.

Herein, it is to be noted that the buffer material layer 2 serves to relieve stress occurring when the transfer mask 10 is fixed to the mask holder 1. In addition, the buffer material layer 2 serves to enlarge the contacting area and further, functions as cushion material.

Moreover, the buffer material layer 20 may be interposed at a connection surface between the upper surface 16 of the thin-film portion 12 and the upper portion holder 2 or at each connection surface between the upper portion holder 2 and the lower portion holder 3 from the above-mentioned reason.

Herein, it is preferable that the buffer material layer 20 is formed by metal or alloy from the viewpoint of heat and electrical characteristic. In this event, when the transfer mask 10 is mounted to the mask holder 1 via adhesives, it is difficult to replace the transfer mask 10. Therefore, it is undesirable to use the adhesives.

In this case, there are a low melting-point metal, such as, Al, Au, Su, In, Zn, Bi, and Pb or alloy containing at least one selected from these metals as the metal or alloy constituting the buffer material layer 20. As a specific example of the alloy, there are, for example, Au—Sn, Au—In, Sn—Sb, and Ag—In and like. In the case of further softening the buffer material layer 20 after processing the buffer material, the buffer material is annealed in low oxygen or under vacuum.

The method of forming the buffer material layer 20 is not particularly limited. For example, the buffer material layer 20 may be formed by manufacturing metallic foil consisting of metal material of low melting point and partially melting the metallic foil by heat treatment.

Alternatively, the buffer material layer 20 can be formed by fabricating a layer of low melting point metal by the use of the known partial sputtering process, the partial galvanizing process and the partial vaporizing process, and melting the metal layer of low melting point by heat treatment.
(Fourth Embodiment)

Subsequently, description will be made about a fourth embodiment of this invention with reference to FIG. 5.

The fourth embodiment is similar to the first embodiment except that the mask holder 1 is composed of an upper portion holder 2, an intermediate holder 6, and a lower portion holder 6.

The mask holder 1 can be readily processed by arranging the intermediate holder 6 between the upper portion holder 2 and the lower portion holder 3. Further, it is possible to improve the processing accuracy according to fourth embodiment.

In this case, the above-mentioned mask holder 1 is formed by material which has hardness of the same level as the silicon or smaller than the silicon. Consequently, it is difficult that defects occur when the transfer mask 10 is fixed to the mask holder 1. As a result, the mask holder 1 of each embodiment can be preferably used as the holder for the transfer mask 10.

Hereinafter, description will be made about examples of this invention in more detail.
(Fifth Embodiment)

Subsequently, description will be made about a fifth embodiment of this invention with reference to FIG. 6.

Figure 6:
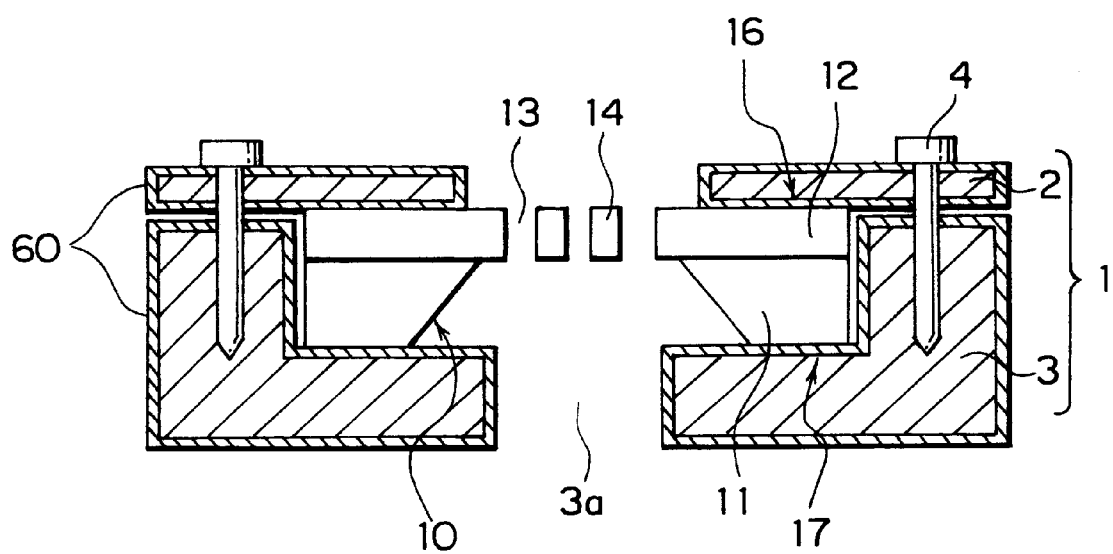
FIG. 6 is a cross sectional view showing a mask holder for supporting a transfer mask according to a fifth embodiment of this invention.

The mask holder 1 illustrated in FIG. 6 has a structure similar to the first embodiment. With such a structure, each of the upper portion holder 2 and the lower portion 3 is formed by silver-copper alloy (namely, sterling silver) containing copper of 7 at%.

Further, noble metal layers 60 are formed on the entire surface of the upper portion holder 2 and the lower portion holder 3. For example, galvanizing (gold) is over-coated thereon as the noble metal layer 60.

By adopting this structure, the mask holder 1, which is superior in both mechanical processing characteristic and corrosion preventing property of the surface, can be realized in addition to the characteristic of the mask holder 1 in the first embodiment.
(First Example)

The mask holder 1 illustrated in FIG. 2 was manufactured. Herein, Ag was selected as material of the mask holder 1. In this condition, the mask holder 1 could be readily manufactured in about 0.5 hour.

Although, the transfer masks 10 of 90 units were mounted to the mask holder 1, no mounting defect is brought about. In this event, the transfer mask 10 was formed by processing the SOI substrate.

Further, the total operation necessary for the mounting could be carried out during a short duration of between 2 and 3 minutes per one unit.

Moreover, the obtained mask holder 1, in which the transfer mask 10 was mounted, was examined with respect to the radiation of heat function and the charge-up preventing function, and the transfer accuracy. In consequence, it was confirmed that they were superior.
(First Comparative Example)

Figure 5:
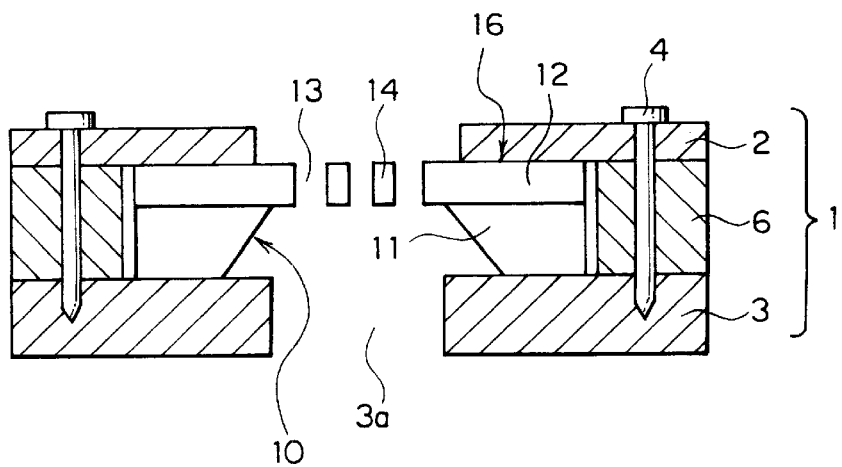
FIG. 5 is a cross sectional view showing a mask holder for supporting a transfer mask according to a fourth embodiment of this invention.

The mask holder 2, 3 illustrated in FIG. 5 was manufactured. Herein, phosphorus bronze was selected as material of the mask holder 2, 3. In this condition, the fabrication of the mask holder 2, 3 took about 1.5 hour, and further, the manufacturing operation was also complex.

Although, the transfer masks 10 of 10 units were mounted to the mask holder 2, 3, 9 units among the 10 units had mounting defects. In this event, the transfer mask 10 was formed by processing the SOI substrate.

Further, the total operation necessary for the mounting was performed during about 210 minutes, and further, the mount fabrication was also complicated.

Moreover, when the drawing operation was carried out, distortion was readily generated for the beam irradiation portion. Thereinafter, accurate drawing operation was impossible.

As mentioned before, although this invention has been explained based upon the embodiments and the example, this invention is not limited to the above-mentioned embodiments and the example.

For instance, the shape of the transfer mask 10 or the mask holder 1 is particularly limited, and square shape, rectangular shape, and circular shape may be adopted.

Further, the mask holder 1 can be used as the holder for the ion-beam exposure mask or the X-ray exposure mask and like other than the electron-beam exposure mask.

What is claimed is:

1. A transfer mask, which includes a thin-film portion having an aperture pattern forming region with aperture patterns therein and a supporting frame portion for supporting said thin-film portion, and which is supported by a mask holder, wherein:
    an outer portion of said transfer mask, except for said aperture pattern forming region, is surrounded by said mask holder.

2. A transfer mask as claimed in claim 1, wherein:
    said mask holder comprises as least a portion which is formed by a heat and electrical conductive material and contacts with said transfer mask.

3. A transfer mask as claimed in claim 1, wherein:

said mask holder comprises at least a portion which is formed by a heat and electrical conductive material and contacts with an upper surface of said thin-film portion.

4. A transfer mask as claimed in claim 1, wherein:

said mask holder comprises at least a portion which is formed by silver or copper of 50 wt % or more in composition.

5. A transfer mask as claimed in claim 1, wherein:

said mask holder has a hardness of the same level as silicon or smaller than the silicon.

6. A transfer mask as claimed in claim 1, wherein:

said transfer mask is formed by processing an SOI Substrate.

7. A transfer mask as claimed in claim 1, wherein:

a noble metal layer is formed on an entire surface of said mask holder to prevent oxidation of the surface of said mask holder.

8. A transfer mask as claimed in claim 1, wherein;

said transfer mask comprises a stencil mask having an aperture pattern for passing a charged particle-ray.

9. A transfer mask as claimed in claim 1, wherein:

said transfer mask comprises an X-ray mask having an aperture pattern for passing an x-ray.

10. A transfer mask which includes a thin-film portion having an aperture pattern forming region with aperture patterns therein and a supporting frame portion for supporting said thin-film portion, and which is supported by a mask holder, wherein:

said mask holder comprises an upper portion holder and lower portion holder;

said upper portion holder has an aperture at a place which corresponds to at least said aperture pattern region and partially contacts with an upper surface of said thin-film portion except for said aperture pattern forming region, said lower portion holder has an aperture which corresponds to at least said aperture pattern region and partially contacts with an bottom surface of said supporting frame portion.

11. A transfer mask as claimed in claim 10, wherein:

said upper portion holder of said transfer mask contacts with the upper surface of said thin-film portion with a predetermined distance from the side end portion to the central portion of said thin-film;

said transfer mask has a preselected thickness; and the distance is larger than the thickness.

12. A transfer mask as claimed in claim 10, wherein:

said upper portion holder and said lower portion holder being fixed to each other.

13. A transfer mask as claimed in claim 12, wherein:

said upper portion holder is fixed to said lower portion holder via a fixing screw.

14. A transfer mask as claimed in claim 12, wherein:

said lower portion holder of said transfer mask has a screw structure portion; and said upper portion holder is fixed to said lower portion holder by screwing said screw structure portion into said upper portion holder.

15. A transfer mask as claimed in claim 10, wherein:

said mask holder further comprises an intermediate holder; and said intermediate holder is located between said upper holder and said lower portion holder.

16. A transfer mask as claimed in claim 15, wherein:

said buffer material layer is arranged so as to relieve stress occurring when the transfer mask is fixed to said mask holder.

17. A transfer mask as claimed in claim 10, wherein:

buffer material layers are interposed between said upper portion holder and said lower portion holder and between said lower portion holder and between said supporting frame portion arid said lower portion holder.

18. A transfer mask as claimed in claim 17, wherein:

said buffer material layer is formed by at least one of a metal or metal alloy.

19. A transfer mask as claimed in claim 10, wherein:

said mask holder comprises at least a portion which is formed by silver or copper of 50 wt % or more in composition.

20. A transfer mask as claimed in claim 10, wherein:

said mask holder has a hardness of the same level as silicon or smaller than the silicon.

21. A transfer mask as claimed in claim 10, wherein:

said transfer mask is formed by processing an SOI substrate.

22. A transfer mask as claimed in claim 10, wherein:

a noble metal layer is formed on an entire surface of said mask holder to prevent oxidation of the surface of said mask holder.

23. A transfer mask as claimed in claim 10, wherein;

said transfer mask comprises a stencil mask having an aperture pattern for passing a charged particle-ray.

24. A transfer mask as claimed in claim 10, wherein:

said transfer mask comprises an x-ray mask having an aperture pattern for passing an x-ray.

* * * * *